(12) United States Patent
Kim

(10) Patent No.: US 9,455,002 B2
(45) Date of Patent: Sep. 27, 2016

(54) AMPLIFYING CIRCUIT AND SEMICONDUCTOR MEMORY DEVICE INCLUDING THE SAME

(71) Applicant: SK hynix Inc., Gyeonggi-do (KR)

(72) Inventor: Sung-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,256

(22) Filed: Sep. 17, 2014

(65) Prior Publication Data

US 2015/0255128 A1    Sep. 10, 2015

(30) Foreign Application Priority Data

Mar. 5, 2014    (KR) .................. 10-2014-0025938

(51) Int. Cl.
```
G11C 7/08       (2006.01)
G11C 7/10       (2006.01)
G11C 7/22       (2006.01)
G11C 7/06       (2006.01)
G11C 11/4091    (2006.01)
G11C 11/4096    (2006.01)
```
(52) U.S. Cl.
CPC .............. *G11C 7/08* (2013.01); *G11C 7/065* (2013.01); *G11C 7/10* (2013.01); *G11C 7/1057* (2013.01); *G11C 7/22* (2013.01); *G11C 11/4091* (2013.01); *G11C 11/4096* (2013.01); *G11C 7/1096* (2013.01)

(58) Field of Classification Search
None
See application file for complete search history.

(56) References Cited

U.S. PATENT DOCUMENTS

| | | | |
|---|---|---|---|
| 2002/0060946 A1* | 5/2002 | Noh | ................. G11C 7/1039 365/233.1 |
| 2007/0014171 A1* | 1/2007 | Ha | ................. G11C 7/06 365/208 |

FOREIGN PATENT DOCUMENTS

| | | |
|---|---|---|
| KR | 100650370 | 11/2006 |
| KR | 1020090037249 | 4/2009 |

\* cited by examiner

*Primary Examiner* — James G Norman
(74) *Attorney, Agent, or Firm* — IP & T Group LLP

(57) ABSTRACT

An amplifying circuit includes a first sense amplifying unit suitable for sensing and amplifying data on input/output lines, a second sense amplifying unit suitable for sensing and amplifying the data on the input/output lines or an output signal of the first sense amplifying unit, and a control unit suitable for activating the first sense amplifying unit during an initial operation period of an active operation and inactivating the first sense amplifying unit after the initial operation period, wherein the second sense amplifying unit performs a sensing and amplifying operation, based on the output signal of the first sense amplifying unit during the initial operation period, and based on the data on the input/output lines after the initial operation period.

12 Claims, 4 Drawing Sheets

AMPLIFYING CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2014-0025938, filed on Mar. 5, 2014, which is incorporated herein by reference in its entirety.

BACKGROUND

1. Field

Exemplary embodiments of the present invention relate to an amplifying circuit and a semiconductor memory device including the same for sensing and amplifying data transmitted between a local input/output line and a global input/output line.

2. Description of the Related Art

In general, data input/output lines are used for transferring data in semiconductor memory devices. Input/output lines for transferring data between data input/output pads and memory cells region are referred to as global data lines. A global data line is coupled to a plurality of banks that are located in a memory cell region. An output of a bit line amplifier is transferred from the memory cell region to a global data line via a local data line. Therefore, a circuit for transferring data between a global data line and a local data line is needed. With dynamic random access memory (DRAM), an input/output sense amplifier (IDSA) is used for transferring data from the local data line to the global data line during a read operation, and a write driver is used for transferring data from the global data line to the local data line during a write operation.

Semiconductor memory devices are always striving for larger storage capacity and lower operating voltages. In large capacity memory devices, there is increased load capacitance on data line pairs. As operating voltages continue to decrease, so do the differential in voltage differences between data line pairs. This decrease in differential voltage is making it more and more difficult for amplifying circuits to sense and amplify data coming from data line pairs.

Having a short RAS to CAS delay time (tRCD) is a key requirement for high speed semiconductor device operation. When minimizing RAS to CAS delay time (tRCD_min) for high speed operation, if bit line voltage levels are dropped and do not recover to a sufficient level, a pair of local input/output lines may not have enough potential difference to transmit and receive data properly. In other words, when a read command signal is applied after an active operation, the voltage level difference in the pair of local input/output lines is weakened because the bit line sense amplifier cannot operate properly. Therefore, a sense amplifying unit for sensing and amplifying minimum voltage level differences is needed. A multi stage amplifying scheme has been proposed to increase data transmission efficiency during high speed operations. A sense amplifying unit using a multi stage amplifying scheme amplifies data of a pair of local input/output lines in two stages. Since the multi stage amplifying operations are sequentially driven in response to separate strobe signals, offset characteristics of the input signal are improved. Therefore, small potential differences (e.g., 100 mv) in the pair of local input/output lines may be amplified and transferred to the global data line. That is, an input/output sense amplifying unit using a multi stage amplifying scheme may improve data transmission efficiency with a minimized RAS to CAS delay time tRCD_min, but it may also increase current consumption.

SUMMARY

Exemplary embodiments of the present invention are directed to an amplifying circuit and a semiconductor memory device including the same for sensing and amplifying data transmitted between a local input/output line and a global input/output line.

The amplifying circuit and the semiconductor memory device including the same may improve operation characteristics and reduce current consumption thereof by controlling an input/output line sense amplifying unit.

In accordance with an exemplary embodiment of the present invention, an amplifying circuit may include a first sense amplifying unit suitable for sensing and amplifying data on input/output lines, a second sense amplifying unit suitable for sensing and amplifying the data on the input/output lines or an output signal of the first sense amplifying unit, and a control unit suitable for activating the first sense amplifying unit during an initial operation period of an active operation and inactivating the first sense amplifying unit after the initial operation period, wherein the second sense amplifying unit performs a sensing and amplifying operation, based on the output signal of the first sense amplifying unit during the initial operation period, and based on the data on the input/output lines after the initial operation period.

The initial operation period may be from when an active command signal is applied until the second sense amplifying unit is driven.

The control unit may include an enable signal generation unit suitable for generating an enable signal, which is activated during the initial operation period, a first strobe signal generation unit suitable for delaying a column selection signal, which is activated during a read operation, and generating a first strobe signal, and a second strobe signal generation unit suitable for delaying the column selection signal and generating a second strobe signal, wherein the first sense amplifying unit is controlled based on the enable signal.

The first strobe signal and the second strobe signal may be sequentially generated.

The first sense amplifying unit may be driven based on the enable signal and the first strobe signal, and the second sense amplifying unit may be driven based on the second strobe signal.

The input/output lines may be local input/output lines.

In accordance with another exemplary embodiment of the present invention, a semiconductor memory device may include a bit line sense amplifier suitable for sensing and amplifying data stored in a memory cell, a data transfer unit suitable for transferring data, which is amplified by the bit line sense amplifier, to a first input/output line based on a column selection signal, a control unit suitable for generating an enable signal, which is activated during an initial operation period after an active command signal is applied, a first sense amplifying unit suitable for sensing and amplifying data on the first input/output line based on the enable signal, a second sense amplifying unit suitable for sensing and amplifying data outputted from the first amplifying unit during the initial operation period, and sensing and amplifying the data on the first input/output line after the initial operation period, and an output driving unit suitable for transferring an output of the sense amplifying unit to a second input/output line.

The control unit may include an enable signal generation unit suitable for generating the enable signal, a first strobe signal generation unit suitable for delaying the column selection signal and generating a first strobe signal, and a second strobe signal generation unit suitable for delaying the column selection signal and generating a second strobe signal, wherein the column selection signal is activated during a read operation.

The first strobe signal and the second strobe signal may be sequentially generated.

The first sense amplifying unit may be driven based on the enable signal and the first strobe signal, and the second sense amplifying unit may be driven based on the second strobe signal.

The first input/output line may be a local input/output line and the second input/output line may be a global input/output line.

In accordance with another exemplary embodiment of the present invention, a semiconductor memory device may include a bit line sense amplifier suitable for sensing and amplifying data stored in a memory cell, a data transfer unit suitable for transferring data, which is amplified by the bit line sense amplifier, to a first input/output line based on a column selection signal, a control unit suitable for delaying the column selection signal, sequentially generating a first strobe signal and a second strobe signal, and generating an enable signal, which is activated during an initial operation period from when an active command signal is applied until the second strobe signal is generated, a first sense amplifying unit suitable for sensing and amplifying data on the first input/output line based on the enable signal and the first strobe signal, a second sense amplifying unit suitable for sensing and amplifying data outputted from the first sense amplifying unit during the initial operation period, and sensing and amplifying the data on the first input/output line after the initial operation period based on the second strobe signal, and an output driving unit suitable for transferring an output of the second sense amplifying unit to a second input/output line.

The control unit may include an enable signal generation unit suitable for generating the enable signal, a first strobe signal generation unit suitable for delaying the column selection signal and generating the first strobe signal, and a second strobe signal generation unit suitable for delaying the column selection signal and generating the second strobe signal, wherein the column selection signal is activated during a read operation.

The enable signal generation unit may be coupled to the second strobe signal generation unit, and may receive the second strobe signal.

The first input/output line may be a local input/output line and the second input/output line may be a global input/output line.

DETAILED DESCRIPTION

Figure 1:
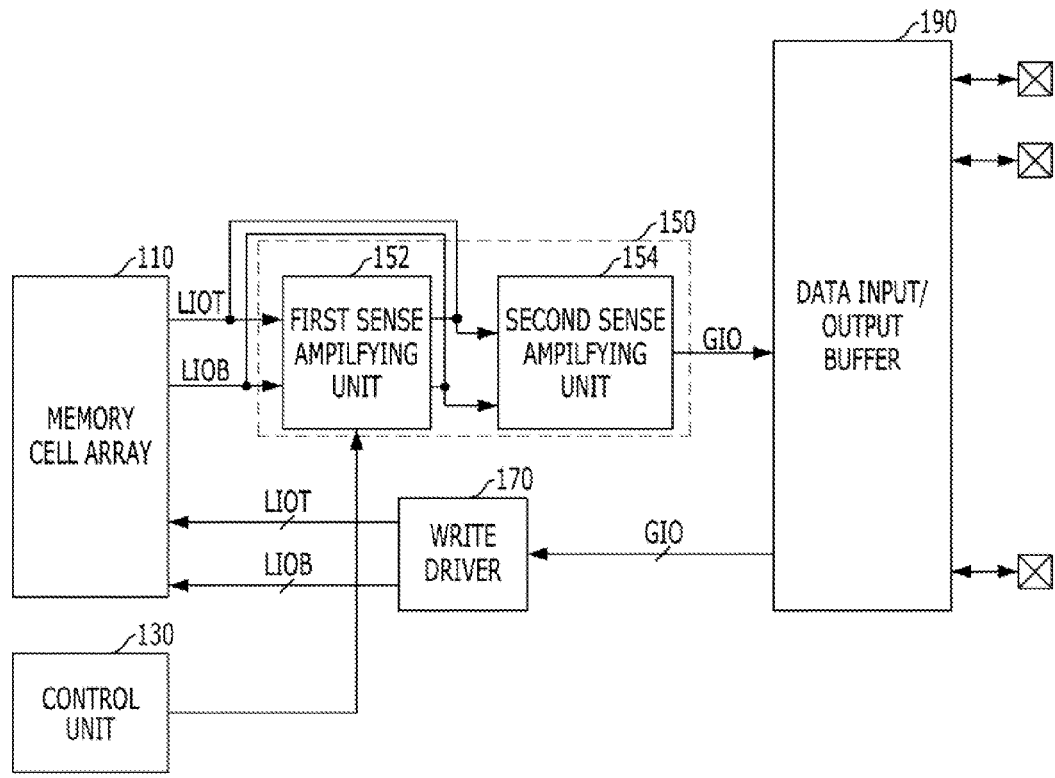
FIG. 1 is a block diagram illustrating a semiconductor memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to dearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore 'include/comprise' or 'including/comprising' used in the specification represents that one or more components, steps, operations, and elements exists or are added.

FIG. 1 is a block diagram illustrating a semiconductor memory device in accordance with an exemplary embodiment of the present invention.

Referring to FIG. 1, a semiconductor memory device 1000 may include a memory cell array 110, a control unit 130, a sense amplifying unit 150, a write driver 170 and a data input/output buffer 190. The sense amplifying unit 150 may include a first sense amplifying unit 152 and a second sense amplifying unit 154.

The memory cell array 110 may include a plurality of memory cells coupled to word lines and bit lines.

The control unit 130 controls the first sense amplifying unit 152 during an initial period of an active operation such that the second sense amplifying unit 154 is driven in response to an output signal of the first sense amplifying unit 152. The control unit 130 controls the first sense amplifying unit 152 to be disabled after the initial period such that the second sense amplifying unit 154 is driven in response to the data on first input/output lines LIOT and LIOB.

The sense amplifying unit 150 is driven during a read operation of the data. The first sense amplifying unit 152 and the second sense amplifying unit 154 of the sense amplifying unit 150 sense and amplify the data on the first input/ output lines LIOT and LIOB when an enable signal is activated. When the enable signal is inactivated, the first sense amplifying unit 152 is not driven.

More specifically, when the enable signal is activated during an initial operation period, the first sense amplifying unit 152 operates, and the data on the first input/output lines LIOT and LIOB are first amplified by the first sense amplifying unit 152 and secondarily amplified by the second sense amplifying unit 154. If the enable signal is inactivated, the first sense amplifying unit 152 stops operating, and the second sense amplifying unit 154 amplifies the data on the input/output lines LIOT and LIOB. The data amplified by the second sense amplifying unit 154 may be transferred to a second input/output line GIO. The data on the second input/output line GIO is transferred to the data input/output buffer 109 and is outputted through a second input/output pad. The first input/output lines LIOT and LIOB may be a local input/output line, and the second input/output line GIO may be a global input/output line. Hereinafter, the first input/output lines LIOT and LIOB are referred to as local input/output lines and the second input/output line GIO are referred to as a global input/output line.

The write driver 170 is driven during a write operation of the data. The data inputted through the data input/output buffer 190 is provided to the write driver 170. Then, the data is transferred to a memory cell selected by the write driver 170.

Figure 2:
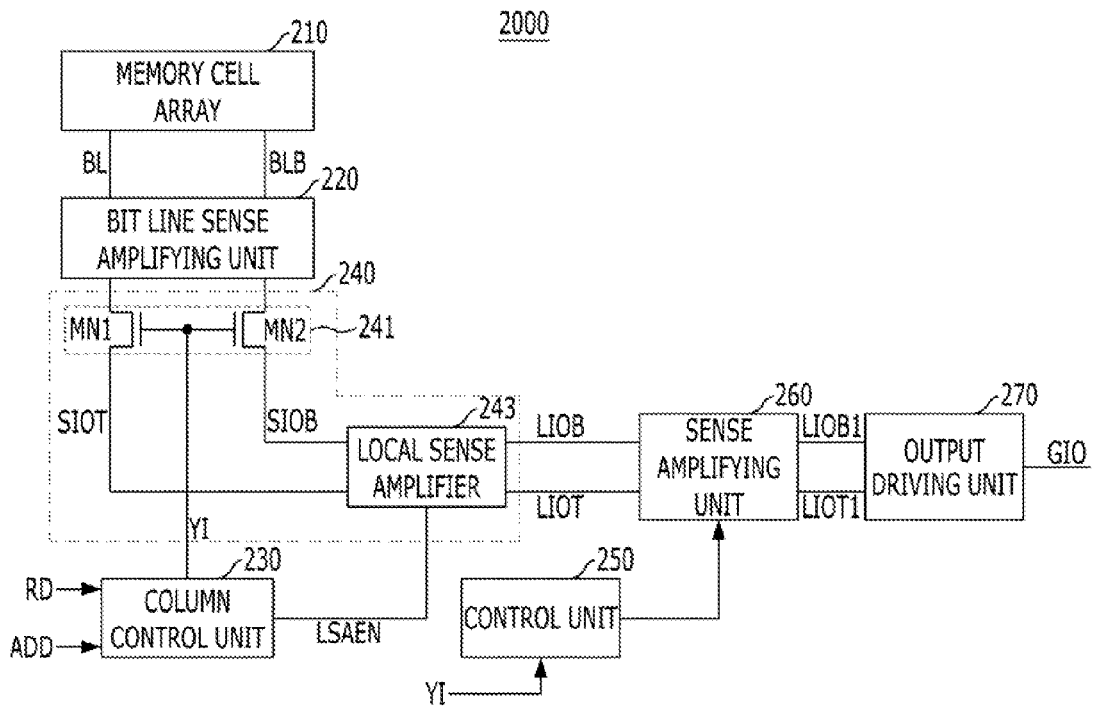
FIG. 2 is a block diagram illustrating a semiconductor memory device in accordance with another exemplary embodiment of the present invention.

FIG. 2 is a block diagram illustrating a semiconductor memory device in accordance with another exemplary embodiment of the present invention.

Referring to FIG. 2, the semiconductor memory device 2000 may include a memory cell array 210, a bit line sense amplifying unit 220, a column control unit 230, a data transfer unit 240, a control unit 250, a sense amplifying unit 260 and an output driving unit 270.

The memory cell array 210 may include a plurality of memory cells coupled to word lines and bit lines.

The bit line sense amplifying unit 220 senses and amplifies the data stored on the memory cell array 210.

The column control unit 230 activates a column selection signal YI and a transfer activation signal LSAEN corresponding to an address signal ADD in response to a read command signal RD and the address signal ADD.

The data transfer unit 240 transfers the data amplified by the bit line sense amplifying unit 220 to the local input/output lines LIOT and LIOB in response to the column selection signal YI. The data transfer unit 240 may include a switch unit 241 and a local sense amplifier 243. The switch unit 241 is switched on in response to the column selection signal YI. If the switch unit 41 is switched on, the data on the bit line is transferred to segment input/output lines SIOT and SIOB. The local sense amplifier 243 is driven in response to the transfer activation signal LASEN, which is activated. The local sense amplifier 243 transfers the data on the segment, input/output lines SIOT and SIOB to the local input/output lines LIOT and LIOB. That is, the local sense amplifier 243 senses voltage differences between the segment input/output lines SIOT and SIOB, and amplifies and transfers the voltage difference to the local input/output lines LIOT and LIOB.

The control unit 250 may control an operation of the sense amplifying unit 260. The detailed descriptions will be followed with reference to FIG. 3.

The sense amplifying unit 260 senses and amplifies the data on the local input/output lines LIOT and LIOB in two stages in response to an output signal of the control unit 250 during an initial operation period. After the initial operation period, the sense amplifying unit 260 senses and amplifies the data on the local input/output lines LIOT and LIOB through a sense and amplification operation of a second stage without a sense and amplification operation of a first stage. The detailed descriptions of the sense amplifying unit 260 will be followed with reference to FIG. 3.

The output driving unit 270 may transfer the data, which is outputted from the sense amplifying unit 260 through output lines LIOT1 and LIOB1 to the global input/output line GIO.

Figure 3:
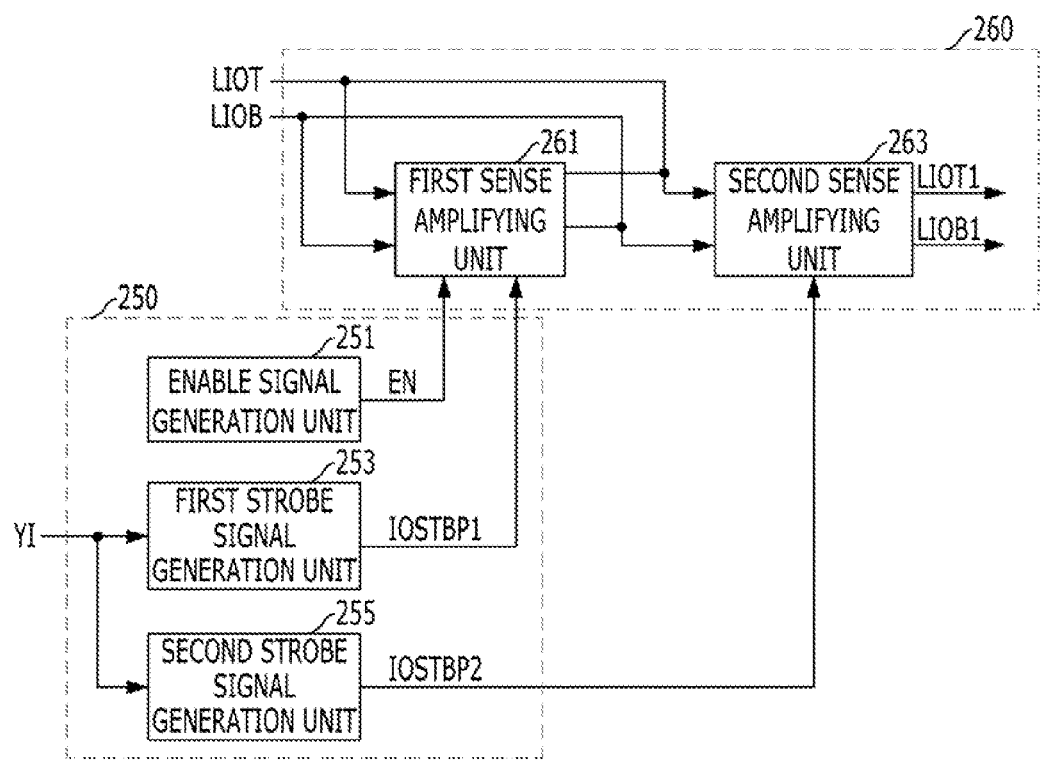
FIG. 3 is a block diagram illustrating an amplifying circuit including a control unit and a sense amplifying unit shown in FIG. 2 in accordance with an exemplary embodiment of the present invention.

FIG. 3 is a block diagram illustrating an amplifying circuit including a control unit 250 and a sense amplifying unit 260 shown in FIG. 2 in accordance with an exemplary embodiment of the present invention.

The control unit 250 may include an enable signal generation unit 251, a first strobe signal generation unit 253 and a second strobe signal generation unit 255. The sense amplifying unit 260 may include a first sense amplifying unit 261 and a second sense amplifying unit 263.

The enable signal generation unit 251 generates an enable signal EN, which is activated during a predetermined initial operation period from when an active command is received. The first strobe signal generation unit 253 delays the column selection signal YI, which is activated during the read operation, and generates a first strobe signal IOSTBP1. That is, the first strobe signal generation unit 253 receives and delays the column selection signal YI, and generates the first strobe signal IOSTBP1.

The second strobe signal generation unit 255 delays the column selection signal VI and generates a second strobe signal IOSTBP2. The second strobe signal generation unit 255 adjusts output timing of the second strobe signal IOSTBP2 such that the second sense amplifying unit 263 operates after an amplification operation of the first sense amplifying unit 261. The first strobe signal IOSTBP1 and the second strobe signal IOSTBP2 are sequentially generated and applied to the first sense amplifying unit 261 and the second sense amplifying unit 263.

The initial operation period may be set as a minimum RAS to CAS delay time (tRCD_min) according to the characteristics of the semiconductor memory device. As described above, operation characteristics of the sense amplifying unit may be deteriorated in the minimum RAS to CAS delay time. Thus, the enable signal EN is activated during the period of the minimum RAS to CAS delay time, and is inactivated after the period of the minimum RAS to CAS delay time.

The first sense amplifying unit 261 senses and amplifies the data on the local input/output lines LIOT and LIOB in response to the enable signal EN and the first strobe signal IOSTBP1.

The second sense amplifying unit 263 senses and amplifies the data on the local input/output lines LIOT and LIOB in response to the second strobe signal IOSTBP2.

More specifically, an active command signal ACT is applied and the enable signal EN is activated during the minimum RAS to CAS delay time. The first strobe signal IOSTBP1 is generated by delaying the column selection signal YI generated using the read command signal RD. The first sense amplifying unit 261 senses and amplifies firstly the data on the local input/output lines LIOT and LIOB in response to the enable signal EN and the first strobe signal IOSTBP1. The second sense amplifying unit 263 senses and amplifies the data secondarily, which is amplified by the first sense amplifying unit 261, in response to the second strobe signal IOSTBP2. That is, the sense amplifying unit 260 performs a sense and amplification operation of two stages.

After the minimum RAS to CAS delay time, the enable signal EN is inactivated and the first sense amplifying unit 261 stops operating. Thus, the second strobe signal IOSTBP2 is generated in response to the read command signal RD. The second sense amplifying unit 263 senses and amplifies the data on the local input/output lines LIOT and LIOB in response to the second strobe signal IOSTBP2.

Figure 4:
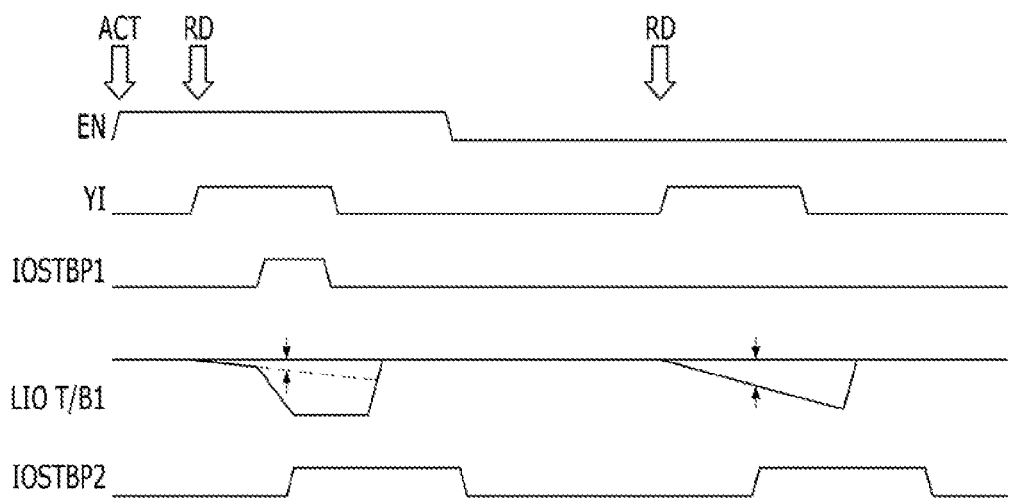
FIG. 4 is a timing diagram illustrating an operation of the amplifying circuit shown in FIG. 3.

FIG. 4 is a timing diagram illustrating an operation of the amplifying circuit shown in FIG. 3.

Referring to FIG. 4, the active corn and signal ACT is applied, and the enable signal En is activated. The enable signal EN is activated during the minimum RAS to CAS delay time and is inactivated after the minimum RAS to CAS delay time. As the read command signal RD is applied, the column selection signal YI is enabled. After the column selection signal VI is delayed for a predetermined time, the first strobe signal IOSTBP1 is enabled, and the second strobe signal IOSTBP2 is sequentially enabled. When the enable signal EN is activated, the first sense amplifying unit 261 and the second sense amplifying unit 263 are driven in response to the first strobe signal IOSTBP1 and the second strobe signal IOSTBP2, and it may be confirmed by the voltage level difference of the output lines LIOT1 and LIOB1. When the enable signal EN is inactivated, the second sense amplifying unit 261 is driven in response to the second strobe signal IOSTBP2 and it may be confirmed by the voltage level difference of the output lines LIOT1 and LIOB1.

That is, the amplifying circuit in accordance with an embodiment of the present invention senses and amplifies the data on the local input/output lines by driving the first sense amplifying unit 261 and the second sense amplifying unit 263 during the minimum RAS to CAS delay time, and driving the second sense amplifying unit 263 after the minimum RAS to CAS delay time. Thus, the amplifying circuit may improve operation characteristics during the minimum RAS to CAS delay time, and may reduce current consumption by driving only the second sense amplifying unit after the minimum RAS to CAS delay time.

Figure 5:
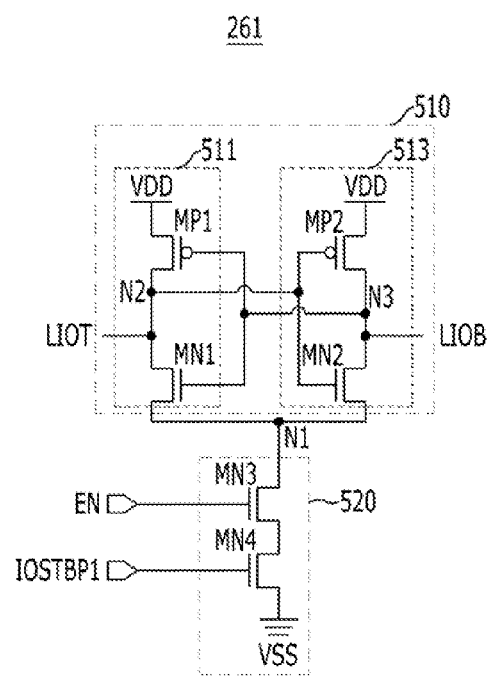
FIG. 5 is a detailed circuit diagram illustrating a first sense amplifying unit of the amplifying circuit shown in FIG. 3.

FIG. 5 is a detailed circuit diagram illustrating a first sense amplifying unit 261 of the amplifying circuit shown in FIG. 3.

Referring to FIG. 5, the first sense amplifying unit 261 may include a first latch unit 510 and a first current sink unit 520. The first latch unit 510 may include a first inverter unit 511 and a second inverter unit 513.

The first latch unit 510 and the first current sink unit 520 are coupled between a power supply voltage VDD terminal and a ground voltage VSS terminal. A first node N1 is coupled between the first latch unit 510 and the first current sink unit 520. The first inverter unit 511 is coupled between the power supply voltage VDD terminal and the first node N1. The second inverter unit 513 is coupled between the power supply voltage VDD terminal and the first node N1.

The first latch unit 510 has a cross coupled structure and amplifies and outputs a differential signal inputted through the local input/output lines LIOT and LIOB. The first inverter unit 511 includes a first PMOS transistor MP1 and a first NMOS transistor MN1, which are driven based on a voltage of a third node N3, between the power supply voltage VDD terminal and the first node N1. The first PMOS transistor MP1 has a source-drain path coupled between the power supply voltage VDD terminal and a second node N2, and receives the voltage of the third node N3 through a gate thereof. The first NMOS transistor MN1 has a source-drain path coupled between the first node N1 and the second node N2, and receives the voltage of the third node N3 through a gate thereof.

The second inverter unit 513 may include a second PMOS transistor MP2 and a second NMOS transistor MN2, which are driven based on a voltage of the second node N2, between the power supply voltage VDD terminal and the first node N1. The second PMOS transistor MP2 has a source-drain path coupled between the power supply voltage VDD and the third node N3, and receives the voltage of the second node N2 through a gate thereof. The second NMOS transistor MN2 has a source-drain path coupled between the first node N1 and the third node N3, and receives the voltage of the second node through a gate thereof.

The first current sink unit 520 may include a third NMOS transistor MN3 and a fourth NMOS transistor MN4, which are serially coupled between the first node N1 and the ground voltage VSS terminal. The third NMOS transistor MN3 and the fourth NMOS transistor MN4 may have a source-drain path coupled between the first node N1 and the ground voltage VSS terminal. A gate of the third NMOS transistor MN3 receives the enable signal EN. A gate of the fourth NMOS transistor MN4 receives the first strobe signal IOSTBP1.

Hereinafter, an operation of the first inverter unit 511 and the second inverter unit 513 will be described as below.

The data on the local input/output lines LIOT and LIOB is inputted through the second node N2 and the third node N3. A gate of the first inverter unit 511 and a gate of the second inverter unit 513 are driven based on a voltage level of the local input/output lines. For example, when a high logic level of data is applied through a positive input/output line LIOT and a low logic level of data is applied through a negative input/output line LIOB, the second NMOS transistor MN2 of the second inverter unit 513 and the first PMOS transistor MP1 of the first inverter unit 511 are driven. When the activated enable signal EN is applied and the first strobe signal is applied, the third NMOS transistor MN3 and the fourth NMOS transistor MN4 are driven. Thus, as a current path is formed between the second NMOS transistor MN2 and the ground voltage VSS terminal, a voltage level of the third node N3 becomes lower than the previous voltage level of the third node N3. Moreover, as a current path is formed between the power supply voltage VDD terminal and the first PMOS transistor MP1, a voltage level of the second node N2 becomes higher than the previous voltage level of the second node N2. That is, the voltage level difference between the positive local input/output line LIOT and the negative local input/output line LIOB is increased as compared with the initial voltage level difference.

On the other hand, since the third NMOS transistor MN3 is not driven when the enable signal EN is inactivated, a current path is not formed. Thus, if the enable signal EN is inactivated, the first sense amplifying unit 261 does not operate.

Figure 6:
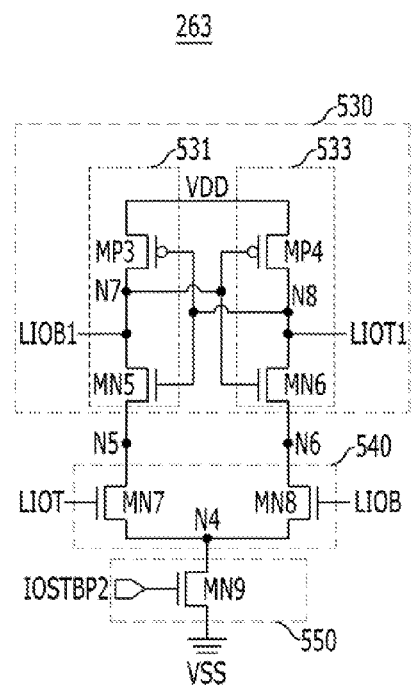
FIG. 6 is a detailed circuit diagram illustrating a second sense amplifying unit of the amplifying circuit shown in FIG. 3.

FIG. 6 is a detailed circuit diagram illustrating a second sense amplifying unit: 263 of the amplifying circuit shown in FIG. 3.

Referring to FIG. 6, the second amplifying unit 263 may include a second latch unit 530, a signal input unit 540 and a second current sink unit 550. The second latch unit 530 may include a third inverter unit 531 and a fourth inverter unit 533.

The second latch unit 530, the signal input unit 540 and the second current sink unit 550 are coupled between the ground voltage VSS terminal and the power supply voltage VDD terminal. A fourth node N4 is coupled between the signal input unit 540 and the second current sink unit 550. A fifth node N5 and a sixth node N6 are coupled between the second latch unit 530 and the signal input unit 540.

The second latch unit 530 has a cross-coupled structure having a third inverter unit 531 and a fourth inverter unit 533, and amplifies and outputs a differential signal.

The third inverter unit 531 may include a third PMOS transistor MP3 and a fifth NMOS transistor MN5, which are driven based on a voltage of an eighth node N8 between the power supply voltage VDD terminal and the fifth node N5. The third PMOS transistor MP3 has a source-drain path coupled between the power supply voltage VDD terminal and a seventh node N7, and receives the voltage of the eighth node N8 through a gate thereof. The fifth NMOS transistor MN5 has a source-drain path coupled between the fifth node M5 and the seventh node N7, and receives the voltage of the eighth node M8 through a gate thereof.

The fourth inverter unit 533 may include a fourth PMOS transistor MP4 and a sixth NMOS transistor MN6, which are driven based on the voltage of the seventh node N7, between the power supply voltage VDD terminal and the sixth node N6. The fourth PMOS transistor MP4 has a source-drain path coupled between the power supply voltage VDD terminal and the eighth node N8, and receives the voltage of the seventh node N7 through a gate thereof. The sixth NMO transistor MN6 has a source-drain path coupled between the sixth node N6 and the eighth node N8, and receives the voltage of the seventh node N7 through a gate thereof.

The signal input unit 540 may include a seventh NMOS transistor MN7 and an eighth NMOS transistor MN8. The seventh NMOS transistor MN7 has a source-drain path coupled between the fourth node N4 and the fifth node N5, and receives a signal of the positive local input/output line LIOT through a gate thereof. The eighth NMOS transistor MN8 has a source-drain path coupled between the fourth node N4 and the sixth node N6, and receives a signal of the negative local input/output line LIOB through a gate thereof.

The current sink unit 550 may include a ninth NMOS transistor MN9. The ninth NMOS transistor MN9 has a source-drain path coupled between the ground voltage VSS terminal and the fourth node N4, and receives the second strobe signal IOSTBP2 through a gate thereof.

An operation of the second sense amplifying unit 263 will be described below. An input signal is applied to the local input/output lines LIOT and LIOB of the signal input unit 540. The second latch unit 530 outputs an output signal to the output lines LIOT1 and LIOB1 coupled to the seventh node N7 and the eighth node NB by differentially amplifying the voltage level of the fifth node N5 and sixth node N6 in response to the second strobe signal IOSTBP2 and the input signal.

Referring to FIGS. 5 and 6, when the enable signal EN is activated, the first sense amplifying unit 261 amplifies and outputs the data on the local input/output lines LIOT and LIOB in response to the first strobe signal IOSTBP1, and the amplified data is applied to the signal input unit 540 of the second sense amplifying unit 263. The second sense amplifying unit 263 secondarily amplifies the applied data and outputs the amplified data to the output lines LIOT1 and LIOB1 in response to the second strobe signal IOSTBP2. On the other hand, when the enable signal EN is inactivated, the first sense amplifying unit 261 does not operate, and the second sense amplifying unit 263 amplifies and outputs the data on the local input/output lines LIOT and LIOB to the output lines LIOT1 and LIOB1 in response to the second strobe signal IOSTBP2.

Figure 7:
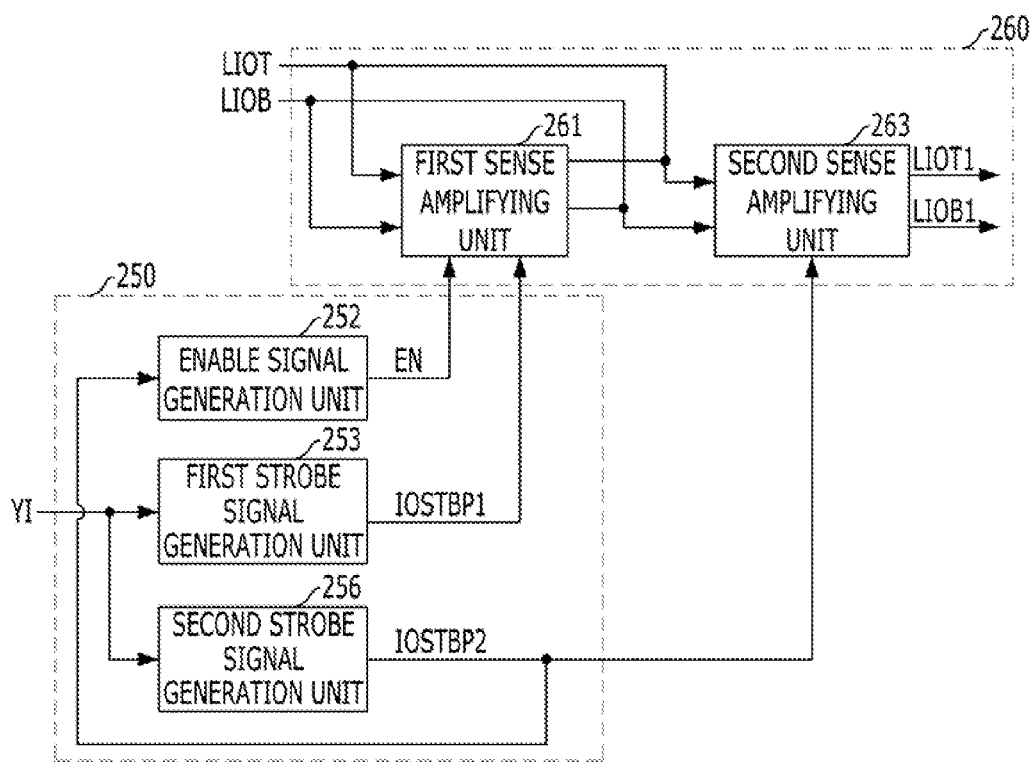
FIG. 7 is a block diagram illustrating an amplifying circuit including a control unit and a sense amplifying unit shown in FIG. 2 in accordance with another exemplary embodiment of the present invention.

FIG. 7 is a block diagram illustrating an amplifying circuit including a control unit 250 and a sense amplifying unit 260 shown in FIG. 2 in accordance with another exemplary embodiment of the present invention.

The control unit 250 may include an enable signal generation unit 252, the first strobe signal generation unit 253 and a second strobe signal generation unit 256. The sense amplifying unit 260 may include the first sense amplifying unit 261 and the second sense amplifying unit 263.

More specifically, the control unit 250 delays a column selection signal YI and generates a first strobe signal IOSTBP1 and a second strobe signal IOSTBP2 sequentially. The control unit 250 generates an enable signal EN during an initial operation period. The initial operation period indicates a period from when an active command signal ACT is applied to when the second strobe signal ISOTBP2 is generated.

The enable signal generation unit 252 generates the enable signal EN, which is enabled when the active command signal ACT is applied and disabled when the second strobe signal IOSTBP2 is applied. The enable signal generation unit 252 receives the second strobe signal IOSTBP2 from the second strobe signal generation unit 256. That is, the second strobe signal IOSTBP2 is fed back to, the enable signal generation unit 252. In other words, the initial operation period represents a period when a first read command signal RD is applied.

Since the configuration of the first strobe signal generation unit 253 and the second strobe signal generation unit 256 shown in FIG. 7 are same as the configuration of the first strobe signal generation unit 253 and the second strobe signal generation unit 255 shown in FIG. 3, except that the second strobe signal generation unit 256 feeds back the second strobe signal IOSTBP2 to the enable signal generation unit 252, detailed descriptions of the first strobe signal generation unit 253 and the second strobe signal generation unit 256 shown in FIG. 7 will be omitted. Moreover, since the configuration of the sense amplifying unit 260 shown in FIG. 7 is same as the configuration of the sense amplifying unit 260 shown in FIG. 3, a detailed description of the sense amplifying unit 260 shown in FIG. 7 will be omitted.

Hereinafter, an operation of the amplifying circuit will be described as below.

The enable signal EN is activated when the active command signal ACT is applied. The first strobe signal IOSTBP1 is generated by delaying the column selection signal YI, which is generated in response to the read command signal RD. The first sense amplifying unit 261 senses and amplifies firstly the data on the local input/output lines LIOT and LIOB in response to the enable signal EN and the first strobe signal IOSTBP1. The second sense amplifying unit 263 senses and amplifies secondarily the data, which is firstly amplified by the first sense amplifying unit 261, in response to the second strobe signal IOSTBP2. The second strobe signal IOSTBP2 is applied to the enable signal generation unit 252 and the enable signal EN is inactivated. Thus, the first sense amplifying unit 261 stops operating. Then, if the read command signal RD is applied the second sense amplifying unit 263 senses and amplifies the data on the local input/output lines LIOT and LOB in response to the second strobe signal IOSTBP2.

Thus, when the enable signal EN is applied to the first sense amplifying unit 261, and the first read command signal RD is applied, the first sense amplifying unit 261 and the second sense amplifying unit 263 are driven. That is, a two-stage sense amplification operation is performed. Then, the second strobe signal IOSTBP2 is generated using the read command signal RD, and only the second sense amplifying unit 263 operates in response to the second strobe signal IOSTBP2.

Figure 8:
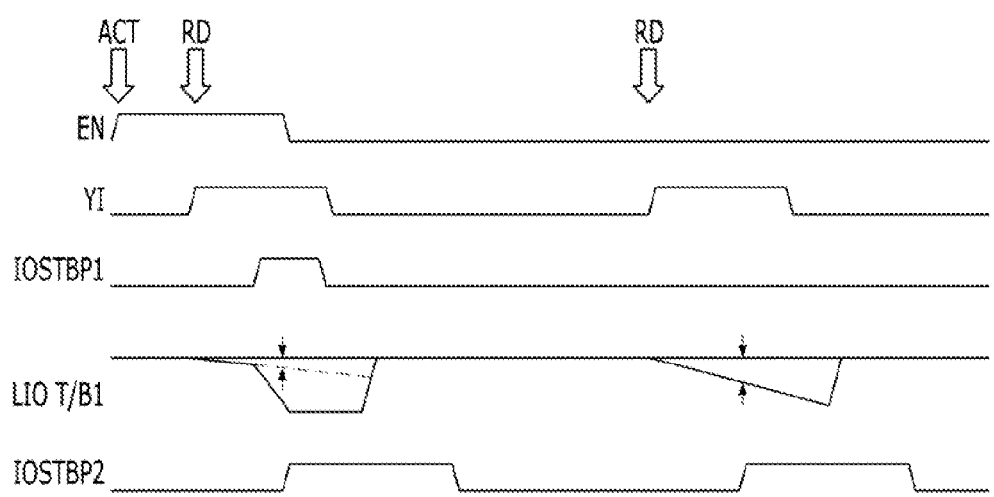
FIG. 8 is a timing diagram illustrating an operation of the amplifying circuit shown in FIG. 7.

FIG. 8 is a timing diagram illustrating an operation of the amplifying circuit shown in FIG. 7.

Referring to FIG. 8, the enable signal EN is activated in response to the active command signal ACT. The enable signal EN is activated until the second strobe signal IOSTBP2 is applied. The enable signal EN is inactivated if the second strobe signal IOSTBP2 is applied. The column selection signal YI is enabled in response to the read command signal RD. The first strobe signal IOSTBP1 is activated after the column selection signal YI is delayed by a predetermined amount, and then the second strobe signal IOSTBP2 is sequentially activated. The first sense amplifying unit and the second sense amplifying unit are driven in response to the first strobe signal IOSTBP1 and the second strobe signal IOSTBP2, respectively, and it may be confirmed by the voltage level difference of the output lines LIOT1 and LIOB1, which receive the data from the sense amplifying unit. The enable signal EN is inactivated in response to the second strobe signal IOSTBP2. When the read command signal READ is applied, only the second sense amplifying unit is driven in response to the second strobe signal IOSTBP2, and it may be confirmed by the voltage level difference of the output lines LIOT1 and LIOB1, which receive the data from the sense amplifying unit.

The amplifying circuit in accordance with embodiments of the present invention drives the first sense amplifying unit and the second sense amplifying unit while the read command signal is applied first. Then, the amplifying circuit senses and amplifies the data on the local input/output lines LIOT and LIOB by driving only the second sense amplifying unit. Thus, the amplifying circuit in accordance with embodiments of the present invention may improve operation characteristics of the sense amplifying unit and reduce current consumption by driving only the second sense amplifying unit after a predetermined time elapses.

While the present invention has been described with respect to the specific embodiments, it will be apparent to those skilled in the art that various changes and modifications may be made without departing from the spirit and scope of the invention as defined in the following claims.

What is claimed is:

1. An amplifying circuit, comprising:
a first sense amplifying unit suitable for sensing and amplifying data on local input/output lines;
a second sense amplifying unit suitable for selectively sensing and amplifying the data on the local input/output lines or an output signal of the first sense amplifying unit according to an initial operation period of an active operation; and
a control unit suitable for activating the first sense amplifying unit during the initial operation period of the active operation and inactivating the first sense amplifying unit after the initial operation period,
wherein the second sense amplifying unit receives, senses and amplifies the output signal of the first sense amplifying unit during the initial operation period, and receives, senses and amplifies the data on the local input/output lines after the initial operation period.

2. The amplifying circuit of claim 1, wherein the initial operation period is from when an active command signal is applied until the second sense amplifying unit is driven.

3. The amplifying circuit of claim 1, wherein the control unit comprises:

an enable signal generation unit suitable for generating an enable signal, which is activated during the initial operation period;
a first strobe signal generation unit suitable for delaying a column selection signal, which is activated during a read operation, and generating a first strobe signal; and
a second strobe signal generation unit suitable for delaying the column selection signal and generating a second strobe signal,
wherein the first sense amplifying unit is controlled based on the enable signal.

4. The amplifying circuit of claim 3, wherein the first strobe signal and the second strobe signal are sequentially generated.

5. The amplifying circuit of claim 3, wherein the first sense amplifying unit is driven based on the enable signal and the first strobe signal, and the second sense amplifying unit is driven based on the second strobe signal.

6. A semiconductor memory device, comprising:
a bit line sense amplifier suitable for sensing and amplifying data stored in a memory cell;
a data transfer unit suitable for transferring data, which is amplified by the bit line sense amplifier, to a local input/output line based on a column selection signal;
a control unit suitable for generating an enable signal, which is activated during an initial operation period after an active command signal is applied;
a first sense amplifying unit suitable for sensing and amplifying data on the local input/output line based on the enable signal;
a second sense amplifying unit suitable for receiving, sensing and amplifying data outputted from the first amplifying unit during the initial operation period, and receiving, sensing and amplifying the data on the local input/output line after the initial operation period; and
an output driving unit suitable for transferring an output of the sense amplifying unit to a global input/output line.

7. The semiconductor memory device of claim 6, wherein the control unit comprises:
an enable signal generation unit suitable for generating the enable signal;
a first strobe signal generation unit suitable for delaying the column selection signal and generating a first strobe signal; and
a second strobe signal generation unit suitable for delaying the column selection signal and generating a second strobe signal,
wherein the column selection signal is activated during a read operation.

8. The semiconductor memory device of claim 7, wherein the first strobe signal and the second strobe signal are sequentially generated.

9. The semiconductor memory device of claim 7, wherein the first sense amplifying unit is driven based on the enable signal and the first strobe signal, and the second sense amplifying unit is driven based on the second strobe signal.

10. A semiconductor memory device, comprising:
a bit line sense amplifier suitable for sensing and amplifying data stored in a memory cell;
a data transfer unit suitable for transferring data, which is amplified by the bit line sense amplifier, to a local input/output line based on a column selection signal;
a control unit suitable for delaying the column selection signal, sequentially generating a first strobe signal and a second strobe signal, and generating an enable signal, which is activated during an initial operation period from when an active command signal is applied until the second strobe signal is generated;

a first sense amplifying unit suitable for sensing and amplifying data on the local input/output line based on the enable signal and the first strobe signal;

a second sense amplifying unit suitable for receiving, sensing and amplifying data outputted from the first sense amplifying unit during the initial operation period, and receiving, sensing and amplifying the data on the local input/output line after the initial operation period, based on the second strobe signal; and an output driving unit suitable for transferring an output of the second sense amplifying unit to a global input/output line.

11. The semiconductor memory device of claim 10, wherein the control unit comprises:

an enable signal generation unit suitable for generating the enable signal;

a first strobe signal generation unit suitable for delaying the column selection signal and generating the first strobe signal; and a second strobe signal generation unit suitable for delaying the column selection signal and generating the second strobe signal, wherein the column selection signal is activated during a read operation.

12. The semiconductor memory device of claim 11, wherein the enable signal generation unit is coupled to the second strobe signal generation unit, and receives the second strobe signal.

* * * * *